(12) United States Patent
Tang et al.

(10) Patent No.: US 7,763,976 B2
(45) Date of Patent: Jul. 27, 2010

(54) INTEGRATED CIRCUIT MODULE WITH INTEGRATED PASSIVE DEVICE

(75) Inventors: Jinbang Tang, Chandler, AZ (US);
Darrel R. Frear, Phoenix, AZ (US);
Robert J. Wenzel, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/242,550

(22) Filed: Sep. 30, 2008

(65) Prior Publication Data

US 2010/0078760 A1 Apr. 1, 2010

(51) Int. Cl.
*H01L 23/34* (2006.01)

(52) U.S. Cl. .......... 257/725; 257/678; 257/723; 257/724

(58) Field of Classification Search ........... 257/528, 257/531, 666, 706, 737, 738, 783, 725; 438/106, 438/381

See application file for complete search history.

(56) References Cited

U.S. PATENT DOCUMENTS

| | | | |
|---|---|---|---|
| 5,138,436 A * | 8/1992 | Koepf | 257/728 |
| 5,182,424 A | 1/1993 | Frank | |
| 5,396,101 A | 3/1995 | Shiga | |
| 5,558,795 A | 9/1996 | Frank | |
| 6,057,202 A | 5/2000 | Chen et al. | |
| 6,140,197 A | 10/2000 | Chu et al. | |
| 6,221,727 B1 | 4/2001 | Chan et al. | |
| 6,437,418 B1 | 8/2002 | Ferrari et al. | |
| 6,472,257 B2 | 10/2002 | Ferrari et al. | |
| 6,809,542 B2 | 10/2004 | Dorman | |
| 6,921,975 B2 * | 7/2005 | Leal et al. | 257/723 |
| 7,095,298 B2 | 8/2006 | Song et al. | |
| 7,119,745 B2 * | 10/2006 | Gaucher et al. | 343/700 MS |
| 7,382,222 B1 | 6/2008 | Manetakis | |
| 2002/0011653 A1 | 1/2002 | Ferrari et al. | |
| 2002/0140052 A1 | 10/2002 | Mimino et al. | |
| 2003/0071325 A1 | 4/2003 | Xu et al. | |
| 2003/0077871 A1 * | 4/2003 | Cheng et al. | 438/381 |
| 2003/0109118 A1 | 6/2003 | Ott et al. | |
| 2004/0066204 A1 | 4/2004 | Dorman | |
| 2004/0212038 A1 | 10/2004 | Ott et al. | |

(Continued)

OTHER PUBLICATIONS

Rudnicki, Janusz and Starski, J. Piotr, Vertical Interconnection for Flip Chip Connection. 14th International Conference on Microwaves, Radar and Wireless Communications, 2002, MIKON-2002, pp. 829-832, vol. 3.

*Primary Examiner*—Thanh V Pham
*Assistant Examiner*—Errol Fernandes
(74) *Attorney, Agent, or Firm*—Jackson Walker L.L.P.

(57) ABSTRACT

A disclosed integrated circuit (IC) module includes an IC panel and multi level circuit structure, referred to as an IPD structure, overlying an upper surface of the IC panel. The IC panel includes an electrically conductive embedded ground plane (EGP), an integrated circuit (IC) die, and an encapsulating material. The EGP is a substantially planar structure that includes or defines a plurality of cavities. The EGP may include or define an IC cavity and an IPD cavity. The IC die may be positioned within the IC cavity such that a perimeter of the IC cavity surrounds the IC die. The IPD structure may define or include a passive device such as an inductor. The passive device may be positioned or located overlying the void in the EGP.

19 Claims, 5 Drawing Sheets

U.S. PATENT DOCUMENTS

| | | |
|---|---|---|
| 2004/0229442 A1 | 11/2004 | Choi |
| 2005/0012571 A1 | 1/2005 | Song et al. |
| 2007/0152298 A1 | 7/2007 | Kim |
| 2008/0116560 A1 | 5/2008 | Mangrum et al. |
| 2008/0173976 A1* | 7/2008 | Stamper et al. ............. 257/531 |
| 2009/0001510 A1 | 1/2009 | Matz et al. |
| 2009/0085133 A1 | 4/2009 | Doan |

* cited by examiner

INTEGRATED CIRCUIT MODULE WITH INTEGRATED PASSIVE DEVICE

BACKGROUND

1. Field

The disclosed subject matter is in the field of integrated circuits and, more specifically, radio frequency integrated circuits.

2. Related Art

Inductors are sometimes integrated with radio frequency (RF) integrated circuits, but the performance characteristics of such inductors as conventionally implemented may be inadequate. It is desirable to implement an assembly or module and a fabrication method to achieve ICs with high performance integrated passive devices.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figures 1, 2:
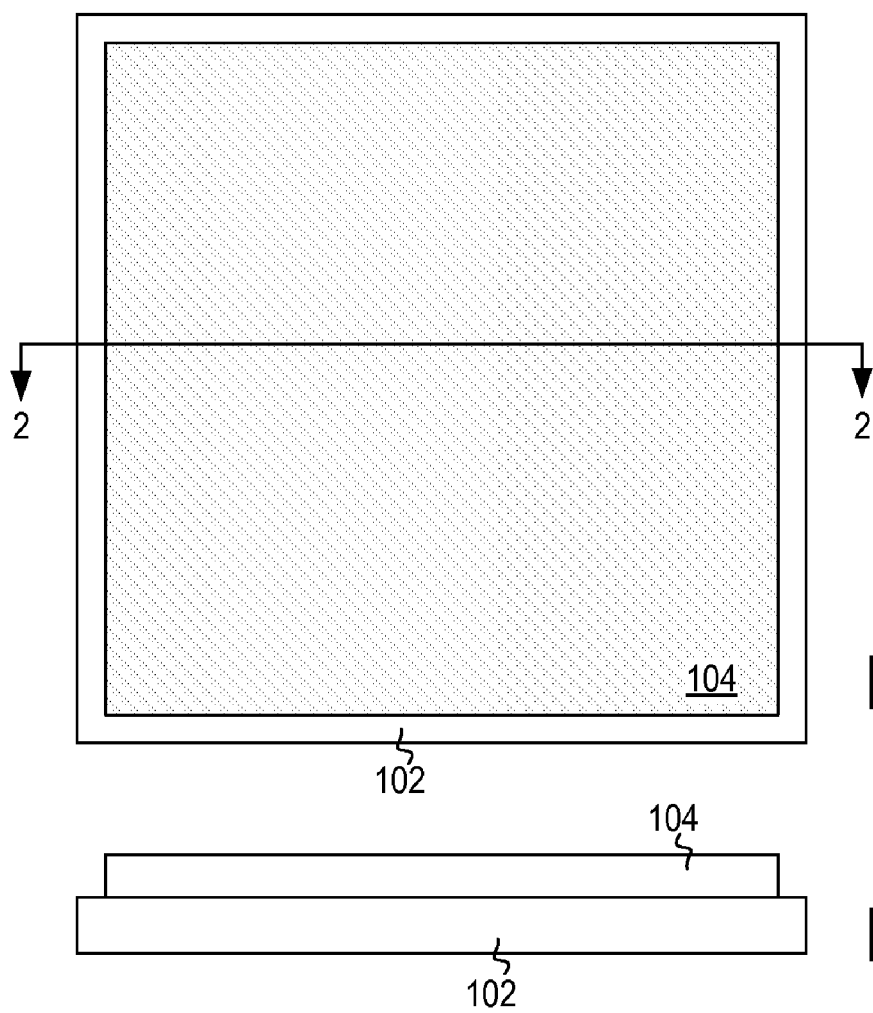
FIG. 1 is a top view of a stage in the fabrication of an integrated circuit module.
FIG. 2 is a sectional view taken along the section 2-2 in FIG. 1.

In one aspect, a disclosed integrated circuit (IC) module includes an IC panel and a multi-level circuit structure overlying an upper surface of the IC panel. The IC panel includes an electrically conductive embedded ground plane (EGP), an IC device or IC die, and an encapsulating material. The EGP is an electrically conductive and substantially planar structure that includes or defines a plurality of cavities, openings, voids, or apertures. The EGP may include an IC cavity and a passive device cavity. The IC die may be located within the IC cavity such that a perimeter of the IC cavity surrounds the IC die. The encapsulating material encapsulates the IC die and the EGP, but may leave an active surface of the IC die and/or a first surface of the EGP exposed.

The multilevel circuit structure may overlie an upper surface of the IC panel. The multilevel circuit structure may include resistive, conductive, and insulating elements that define a passive device, referred to herein as an integrated passive device (IPD) having a first terminal in electrical contact with the IC die. Portions of the IPD overlie the passive device cavity. By eliminating the EGP underlying the IPD, performance characteristics of the IPD may be beneficially altered. For inductive IPDs, for example, the quality factor (Q) value of an inductor in the disclosed module is substantially greater than the Q value of the same inductor formed overlying a conductive portion of an EGP.

The IPD may be implemented as an inductive transmission line element that includes an inductor. The inductor, in turn, may be implemented as a microstrip (MS) inductor or as a coplanar wave guide (CPW) inductor. The EGP may include aluminum, copper, or another suitable conductive material. The EGP may be positioned within the encapsulating material wherein a surface of the EGP is exposed. The active surface of the IC die and the exposed surface of the EGP may be substantially co-planar. An upper surface of the encapsulating material may also be substantially co-planar with the active surface of the IC die, in which case the IC panel has a substantially planar first surface that includes the active surface of the IC die.

The IPD structure may include a first layer formed in contact with an upper surface of the IC panel. The first layer may include a first dielectric layer, a first via or contact that contacts elements of the IC die, and a first interconnect element. The IPD structure may further include a second layer formed in contact with an upper surface of the first layer. The second layer may include a second dielectric layer, second via elements contacting elements of the first dielectric layer, and a second interconnect element. The IPD structure may include additional layers. The IC die may be a radio frequency (RF) IC that is operable as a RF transceiver.

In another aspect, a disclosed method of fabricating an RF module having an integrated inductor includes forming an electrically conductive EGP overlying a substrate or carrier that may include an adhesive surface, forming an IC cavity and an IPD cavity in the EGP, and attaching the IC die to the carrier within a perimeter defined by the IC cavity. The IC die and the EGP are encapsulated in an encapsulating material to form an IC panel. The IC panel may then be separated form the carrier, which may be discarded or re-used.

A multi level circuit structure is then fabricated overlying a first surface of the IC panel. The multi level circuit structure may define an inductor and the inductor may overlie the IPD cavity in the EGP. Forming the EGP may include forming the EGP using aluminum, copper, an alloy thereof, or a combination. Forming the IC cavity and IPD may include dry etching selective portions of the EGP. Encapsulating the IC and the EGP may include spin depositing a polymer encapsulating material, applying a molding material to the IC and the EGP, or forming an epoxy-based encapsulant and heat curing the encapsulant. The carrier may be removed by heating the carrier with ultra violet light, using a liquid solvent, or another suitable technique.

In another aspect, a disclosed multi-component assembly includes a radio frequency (RF) integrated circuit operable as an RF transceiver, an electrically conductive EGP that includes a device cavity defining a device cavity perimeter that surrounds the semiconductor device and an IPD cavity. A dielectric encapsulating the semiconductor device and the EGP exposes an active surface of the semiconductor device.

The assembly may include a plurality of interconnect layers formed overlying the encapsulating dielectric. The plurality of interconnect layers may define an inductor that overlies the IPD cavity. The inductor might include a microstrip inductor and/or a coplanar waveguide inductor.

Turning now to the drawings, FIG. 1 through FIG. 13 include top views and sectional views at selected stages in a semiconductor fabrication process suitable for fabricating an IC module 200 (FIG. 12 and FIG. 13) as disclosed herein. In the embodiment depicted in the top view of FIG. 12 and sectional view of FIG. 13, IC module 200 includes an IC panel 160 and a multilevel circuit structure 170 overlying IC panel 160. IC panel 160 as depicted includes an integrated circuit (IC) die 140, an embedded ground plane (EGP) 104, and an encapsulating material 150. In some embodiments, IC die 140 is a radio frequency IC that is operable as an RF transceiver.

Figure 12:
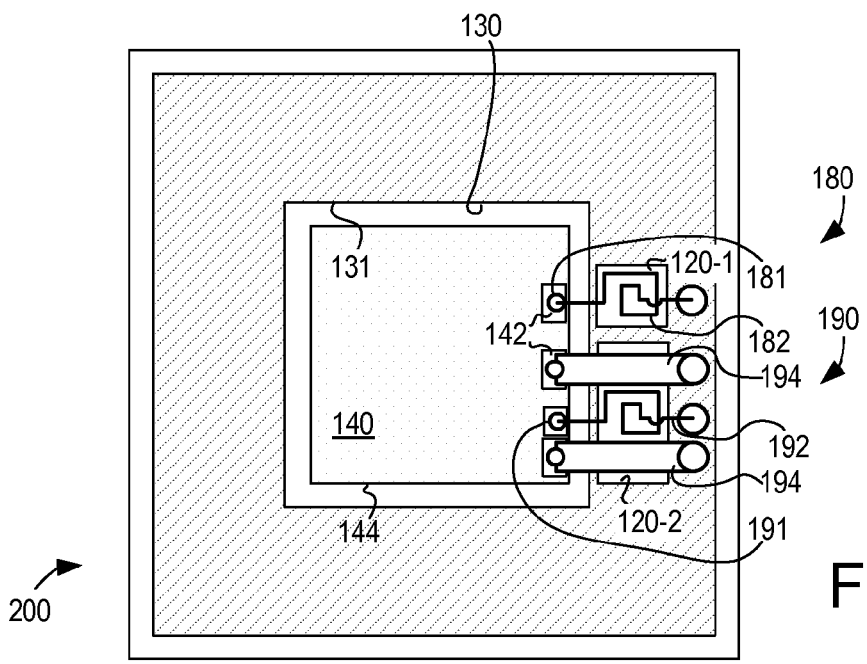
FIG. 12 is a top view of the integrated circuit module including at least one integrated passive device that is connected at one terminal to the integrated circuit die where a portion of the passive device is located overlying the passive device cavity.

Multilevel circuit structure 170 includes a set of one or more layers 171. A layer 171 may have electrically insulating portions, including dielectric layers 172 and 176, and electrically conductive elements, including interconnects 178, and vias or contacts 174. One or more layers 171 of multilevel circuit structure 170 may define an IPD that connects, at one terminal, to a pad 142 of IC die 140. As depicted in FIG. 12, for example, an IPD may be an inductive transmission line element including, as examples, an MS inductor 180 or a CPW inductor 190. Although MS inductor 180 and CPW inductor 190 are both illustrated in FIG. 12, embodiments may include just a single inductor. Moreover, other embodiments may include different types of IPDs including, for example, capacitors, resistors, and so forth.

As depicted in FIG. 12, EGP 104 includes or defines a cavity, referred to herein as IC cavity 130, and one or more voids or cavities, referred to herein as IPD cavities 120. IC die 140 is positioned with its perimeter 144 surrounded by a perimeter 131 of IC cavity 130. In addition, at least some of the passive devices that IC module 200 may include are positioned overlying an IPD cavity 120. In FIG. 12, for example, MS inductor 180 overlies a first IPD cavity 120-1 and CPW inductor 190 overlies a second IPD cavity 120-2. Whereas EGP 104 includes an electrically conductive element or material, IPD cavities 120 are filled with an epoxy or other type of electrically insulating material. By positioning IPDs including inductors 180 and 190 overlying IPD cavities 120, the depicted embodiment of IC module 200 is believed to produce inductors with a superior quality factor (Q) value.

Referring now to the top view of FIG. 1 and the sectional view of FIG. 2, taken along the sectional line 2-2 of FIG. 1, an initial stage in a process for fabricating IC module 200 is depicted. In the depicted embodiment, EGP 104 is formed overlying a sacrificial carrier 102, which may have an adhesive on its surface. In some embodiments, EGP 104 is an electrically conductive plate that is deposited or physically attached to carrier 102. EGP 104 may include, as examples, copper, aluminum, or another suitable metal or other conductive material. In some embodiments, a thickness of EGP 104 is in the range of approximately 75 to approximately 200 micrometers (microns).

Figure 3:
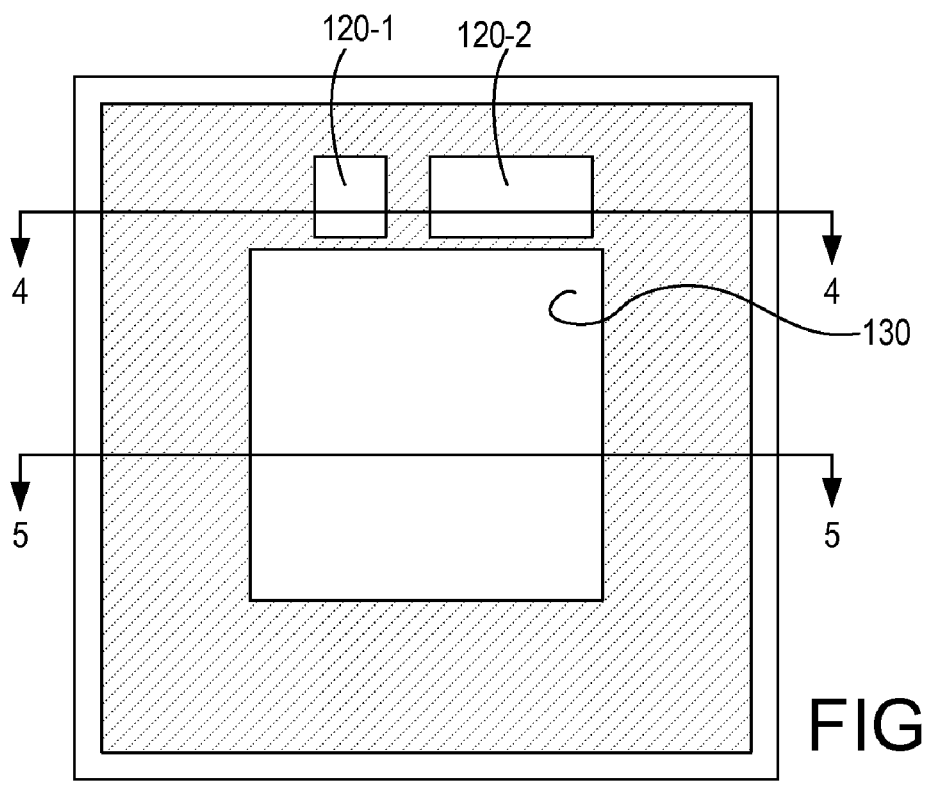
FIG. 3 is a top view of a fabrication stage subsequent to FIG. 1 emphasizing the inclusion of cavities for the integrated circuit die as well as for the integrated passive device.
Figure 4:
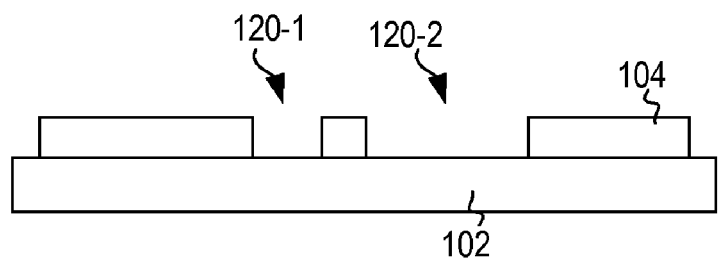
FIG. 4 is section view taken along the section 4-4 of FIG. 3.
Figure 5:
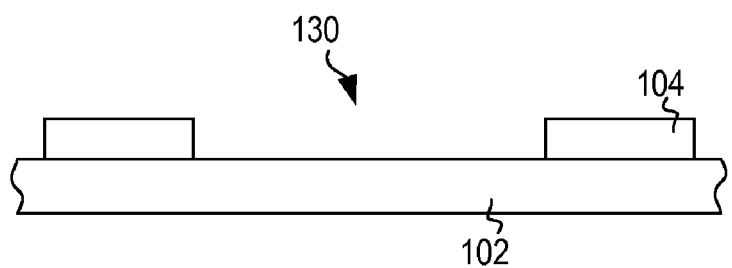
FIG. 5 is section view taken along the section 5-5 of FIG. 3.

Turning now to the top view of FIG. 3 and the sectional views of FIG. 4 and FIG. 5, taken along sectional lines 4-4 and 5-5 respectively of FIG. 3, a subsequent stage in the fabrication process is illustrated. As depicted, cavities are formed in EGP 104. In the depicted embodiment, the cavities include an IC cavity 130 and one or more IPD cavities 120. IC die cavities 130 as depicted in FIG. 3 is sufficiently sized to accommodate an IC die that will be introduced into the IC module subsequently. Although FIG. 3 depicts a single IC cavity 130, other embodiments may employ two or more such cavities to accommodate two or more integrated circuit die that may be included in IC module 200. Similarly, although FIG. 3 depicts two IPD cavities 120-1 and 120-2, other implementations may employ more or fewer cavities. IC cavity 130 and IPD cavities 120 may be formed using known dry etch, wet etch or other suitable selective material removal procedures.

Figure 6:
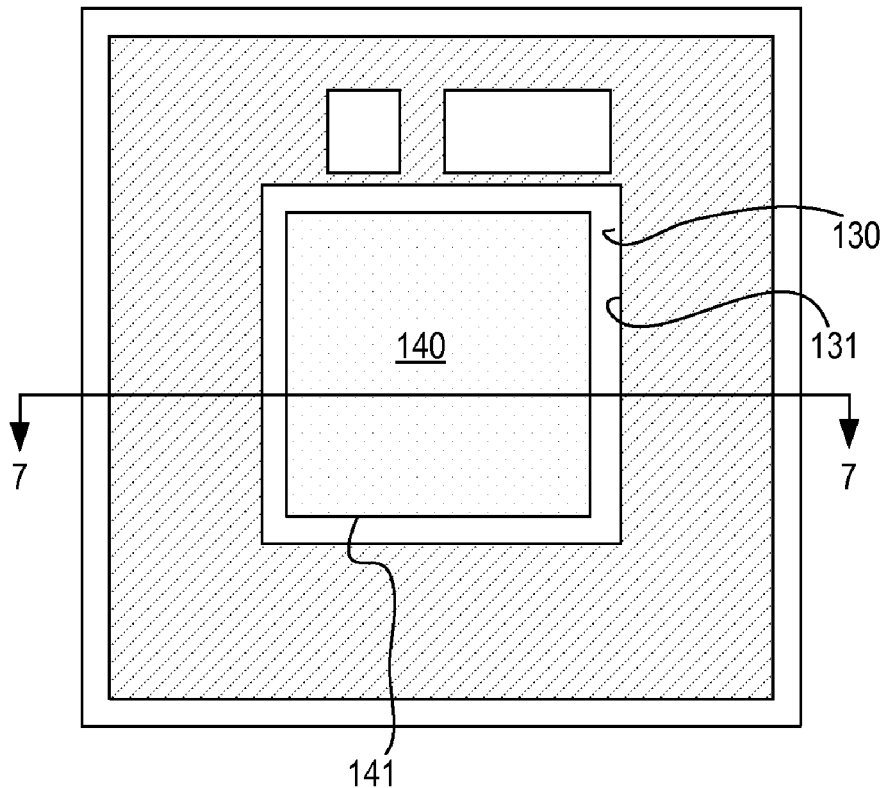
FIG. 6 is a top view of a fabrication stage subsequent to FIG. 3 illustrating the placement of the integrated circuit die.
Figure 7:
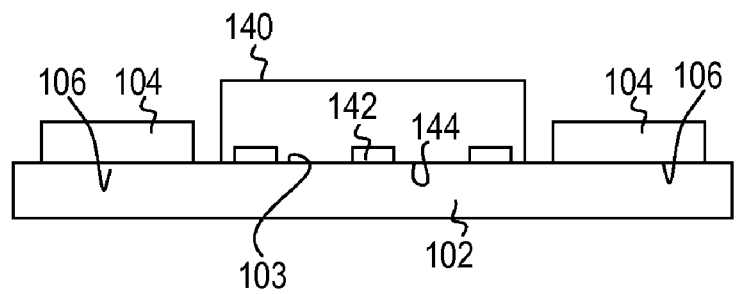
FIG. 7 is section view taken along the section 7-7 of FIG. 6.

Turning now to the top view of FIG. 6 and the sectional view of FIG. 7, taken along the section line 7-7 of FIG. 6, a subsequent stage in the fabrication process is depicted. In the depicted stage, an IC die 140 has been attached to carrier 102 within die cavity 130 of EGP 104 wherein a perimeter 131 of die cavity 130 surrounds a perimeter 141 of IC die 140. In some embodiments, a thickness of IC die 140 is in the range of approximately 250 to approximately 500 microns.

In the depicted embodiment, IC die 140 is attached to EGP 104 with an active surface 144 of IC die 140 in contact with or in very close proximity to an upper surface 103 of carrier 102. Active surface 144 is the surface of IC die 140 to which the transistors and other active elements (not depicted) of IC die 104 are in closest proximity. A set of electrically conductive pads 142 of IC die 140 are exposed at active surface 144. In the depicted embodiment, a front surface 106 of EGP 104 is in contact with or in very close proximity to carrier 102. Thus, in this embodiment, front surface 106 of EGP 104 and active surface 144 of IC die 140 are substantially coplanar.

Figure 8:
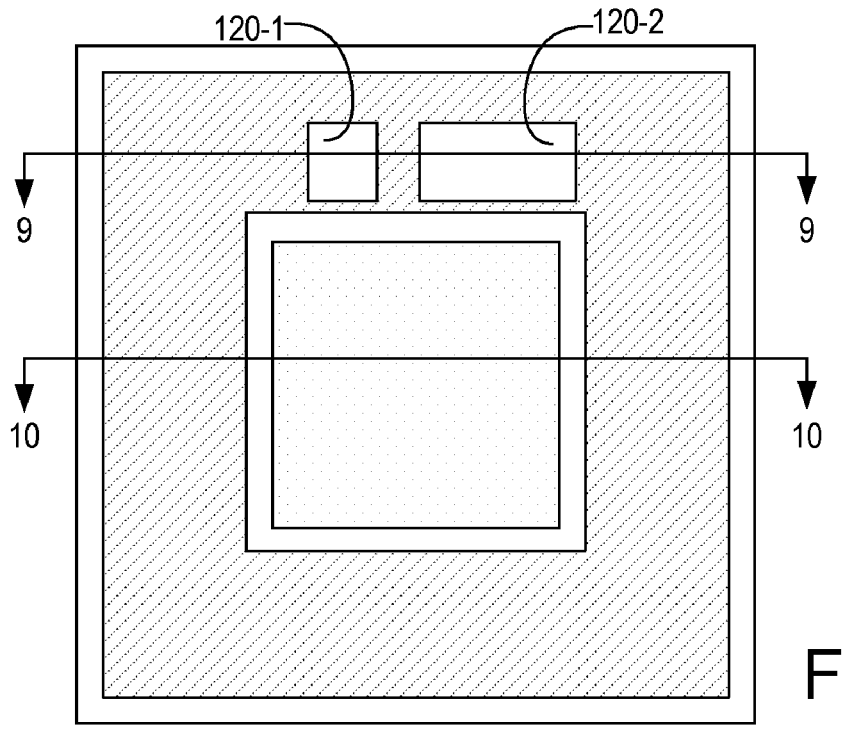
FIG. 8 is a top view of a fabrication stage subsequent to FIG. 6 illustrating the formation of an encapsulating material to encapsulate the integrated circuit die and an embedded ground plane.
Figure 9:
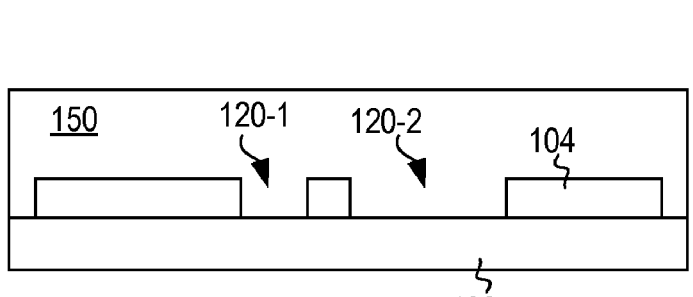
FIG. 9 is section view taken along the section 9-9 of FIG. 8.
Figure 10:
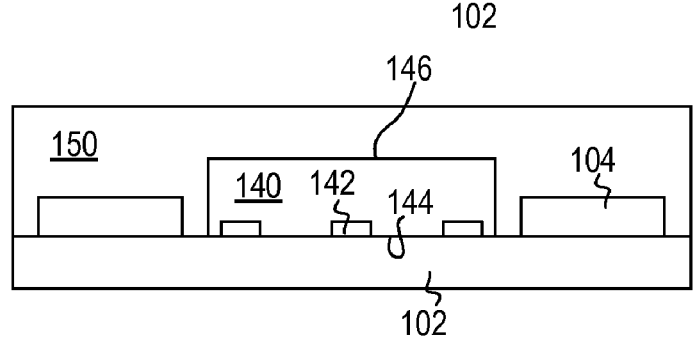
FIG. 10 is a section view taken along the section 10-10 of FIG. 8.

Turning now to the top view of FIG. 8 and the sectional views of FIG. 9 and FIG. 10, taken along section lines 9-9 and 10-10 of FIG. 8, a subsequent stage of the fabrication process is depicted. In the depicted embodiment, an encapsulating layer 150 has been formed on carrier 102 overlying and surrounding EGP 104 and IC die 140 to create an IC panel 160. IC panel 160 includes encapsulating layer 150, IC die 140 and EGP 104.

In one embodiment, encapsulating layer 150 is a dielectric (or insulating) layer such as, for example, a spun-on polymer or a molding material that may be applied using any suitable process. Alternatively, the encapsulating layer 150 may be any commercially available encapsulating material including, as an example, an epoxy-based and heat-curable encapsulating material. In some embodiments, a thickness of encapsulating layer 150 is approximately 100 to 250 microns thicker than IC die 140.

Because carrier 102 contacts active surface 144 of IC die 140, encapsulating layer 150 is formed in contact with exposed surfaces of semiconductor device 140. In the embodiment shown, the exposed surfaces of semiconductor device 140 that are in contact with the encapsulating layer 150 include back side 146 and sidewalls 148 of IC die 140. Thus, encapsulating layer 150 is formed over and surrounding exposed sides of IC die 140.

Figure 11:
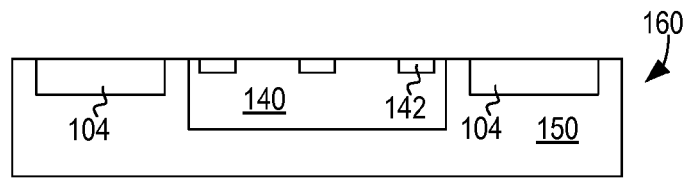
FIG. 11 is a cross sectional view of an IC panel including the integrated circuit die, the embedded ground plane, and the encapsulant.

FIG. 11 depicts a subsequent fabrication process stage after removing carrier 102 from IC panel 160. In some embodiments, carrier 102 may be removed using any process, including heat, e.g., UV light, a solvent, the like or combinations of the above. After carrier 102 is removed, IC panel 160 is flipped over so that the pads 142 of the IC die 140 are exposed.

Figure 13:
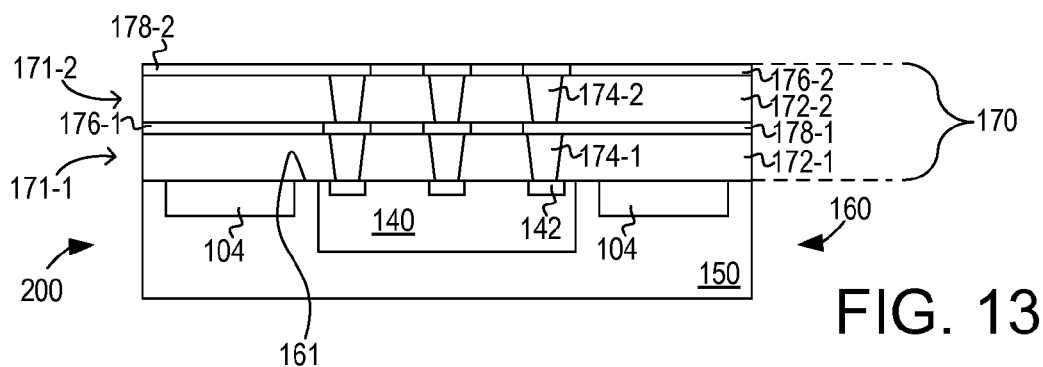
FIG. 13 is a cross section of the integrated circuit module of FIG. 12.

Turning now to the top view of FIG. 12 and the sectional view of FIG. 13, a subsequent process stage is depicted following the formation of IPD structure 170 defining one or more passive devices, e.g., inductors, resistors, or capacitors, that may be connected to IC die 140. The depiction illustrates the inclusion of two types of passive devices, namely, two types of inductive transmission line structures including MS inductor 180 and CPW inductor 190. MS inductor 180 as shown includes a first terminal 181 in electrical contact with an IC pad 142 of IC die 140. Similarly CPW inductor 190 includes a first terminal 191 in electrical contact with a pad 142 of IC die 140. MS inductor 180 may include a coiled conductor 182, which is parallel to a ground plane (not depicted). CPW inductor 190 may include a coiled conductor 192 arranged between a pair of relatively wide grounded conductors 194.

IPD structure 170 as depicted in FIG. 13 may include multiple layers 171-1, 171-2, etc., formed overlying an upper surface 161 of IC panel 160. A layer 171 may include a first dielectric layer 172 and a second dielectric layer 176. First and second dielectric layers 172 and 176 may be formed of conventional spun-on polymer or any other suitable material formed by any suitable process, such as any suitable deposition process. In some embodiments, first dielectric layer 171 may have a thickness of approximately 20 microns and second dielectric layer 176 may have a thickness of approximately 10 microns. Voids may be patterned into first dielectric layer 171 and the voids may then be deposited with or otherwise filled with copper, aluminum, or another suitable metal, alloy, or conductive compound to form contacts 174. Voids formed in second dielectric layer 176 may be deposited with or otherwise filled with copper, aluminum, or another suitable metal, alloy, or conductive compound to form interconnect structures 178.

Through appropriate design and layout, passive devices including MS inductor 180 and CPW inductor 190 may be formed within IPD structure 170. As depicted in the top view FIG. 12, the passive devices are positioned overlying IPD cavities 120 when viewed from the top. The alignment of passive devices, including MS inductor 180 and CPW inductor 190, overlying IPD cavities 120 beneficially improves the Q factor for inductors 180 and 190.

Although the invention is described herein with reference to specific embodiments, various modifications and changes can be made without departing from the scope of the present invention as set forth in the claims below. For example, whereas the depicted implementation illustrates an IPD structure 170 having two layers 171-1 and 171-2, other implementations may have more or fewer layers. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An IC module, comprising:
   an IC panel, comprising:
      an electrically conductive embedded ground plane (EGP) defining an integrated circuit (IC) cavity and an integrated passive device (IPD) cavity;
      an IC die positioned wherein a perimeter of the IC cavity surrounds the IC die; and
      an encapsulating material encapsulating substantially all but an active surface of the IC die and the EGP and filling the IPD cavity; and
   an IPD structure overlying an upper surface of the IC panel, wherein the IPD structure defines an IPD having a first terminal in electrical contact with the IC die and wherein at least a portion of the IPD overlies the encapsulating material filling the IPD cavity.

2. The module of claim 1, wherein the IPD comprises an inductive transmission line element including an inductor.

3. The module of claim 2, wherein the IPD comprises a microstrip (MS) inductor.

4. The module of claim 2, wherein the IPD comprises a coplanar wave guide (CPW) inductor.

5. The module of claim 1, wherein the EGP comprises a conductive material selected from the group consisting of aluminum and copper.

6. The module of claim 1, wherein the EGP includes an exposed surface and further wherein the active surface of the IC die and the exposed surface of the EGP are substantially co-planar.

7. The module of claim 6, wherein an upper surface of the encapsulating material is substantially co-planar with the active surface of the IC die.

8. The module of claim 1, wherein the IPD structure includes a first layer formed in contact with an upper surface of the IC panel, the first layer including a first dielectric layer, first via elements contacting elements of the IC die, and a first interconnect element.

9. The module of claim 8, wherein the IPD structure includes a second layer formed in contact with an upper surface of the first layer, the second layer including a second dielectric layer, second via elements contacting elements of the first dielectric layer, and a second interconnect element.

10. The module of claim 1, wherein the IC die comprises a radio frequency IC.

11. A multi-component assembly, comprising:
    a radio frequency (RF) integrated circuit (IC) operable as an RF transceiver;
    an electrically conductive embedded ground plane (EGP), wherein the EGP includes:
       a device cavity defining a device cavity perimeter that surrounds the RF IC; and
       an IPD cavity;
    an encapsulating material encapsulating the RF IC and the EGP, wherein an active surface of the RF IC, a surface of the EGP, and a surface of the encapsulating material are substantially co-planar and wherein the encapsulating material occupies the IPD cavity;
    a plurality of interconnect layers defining an inductor, wherein the inductor overlies the encapsulating material occupying the IPD cavity.

12. The assembly of claim 11, wherein the inductor comprises a microstrip inductor.

13. The assembly of claim 11, wherein the inductor comprises a coplanar waveguide inductor.

14. The IC module of claim 1, wherein the encapsulating material comprises a spun-on polymer.

15. The IC module of claim 1, wherein the encapsulating material comprises a dielectric molding material.

16. The IC module of claim 1, wherein the encapsulating material comprises an epoxy-based, heat-curable encapsulating material.

17. The multi-component assembly of claim 11, wherein the encapsulating material comprises a spun-on polymer.

18. The multi-component assembly of claim 11, wherein the encapsulating material comprises a dielectric molding material.

19. The multi-component assembly of claim 11, wherein the encapsulating material comprises an epoxy-based, heat-curable encapsulating material.

* * * * *